(12) United States Patent
Hayashi et al.

(10) Patent No.: US 10,813,255 B2
(45) Date of Patent: Oct. 20, 2020

(54) MOTOR DRIVE DEVICE

(71) Applicant: Mitsubishi Electric Corporation, Tokyo (JP)

(72) Inventors: Yoshitomo Hayashi, Tokyo (JP); Satoru Kozuka, Tokyo (JP); Yasuhiro Takadera, Tokyo (JP); Takeshi Obara, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 16/315,029

(22) PCT Filed: Dec. 26, 2017

(86) PCT No.: PCT/JP2017/046754
§ 371 (c)(1),
(2) Date: Jan. 3, 2019

(87) PCT Pub. No.: WO2019/130442
PCT Pub. Date: Jul. 4, 2019

(65) Prior Publication Data
US 2019/0380223 A1   Dec. 12, 2019

(51) Int. Cl.
*H05K 7/20* (2006.01)
*H05K 1/02* (2006.01)
(Continued)

(52) U.S. Cl.
CPC ............ *H05K 7/209* (2013.01); *H02K 11/33* (2016.01); *H05K 1/0203* (2013.01); *H05K 1/181* (2013.01);
(Continued)

(58) Field of Classification Search
CPC .... H05K 7/209–7/20918; H05K 7/202; H05K 7/206; H05K 7/20409
See application file for complete search history.

(56) References Cited

U.S. PATENT DOCUMENTS 4,441,140 A * 4/1984 Richard ............... H05K 7/1461
361/720
5,235,491 A * 8/1993 Weiss ................. H05K 7/20918
307/151
(Continued)

FOREIGN PATENT DOCUMENTS

CN       103929926 A      7/2014
DE   102013015824 B4 *   2/2017  ......... H05K 7/20918
(Continued)

OTHER PUBLICATIONS

Decision to Grant received for Japnese patent application No. 2018-526266, dated Jun. 12, 2018, with English translation 4 pages.
(Continued)

*Primary Examiner* — Robert J Hoffberg
(74) *Attorney, Agent, or Firm* — Xsensus LLP

(57) ABSTRACT

A motor drive device provided to a control panel to drive a plurality of motors includes a plate-shaped fin base that includes a first plate surface and a second plate surface, and a plate-shaped heat radiator that is thermally connected to the first plate surface and is provided with a first normal to its plate surface intersecting a second normal to the first plate surface. The motor drive device also includes a semiconductor device that drives a first motor and is thermally connected to the heat radiator, a semiconductor device that drives a second motor and is thermally connected to the first plate surface, and fins that are thermally connected to the second plate surface opposite from the first plate surface of the fin base and are provided in an air passage formed in the control panel.

6 Claims, 7 Drawing Sheets

(51) Int. Cl.
 *H02K 11/33* (2016.01)
 *H05K 1/18* (2006.01)
(52) U.S. Cl.
 CPC ..... *H05K 7/20163* (2013.01); *H05K 7/20409* (2013.01); *H05K 2201/1009* (2013.01)

(56) References Cited

U.S. PATENT DOCUMENTS

| | | | | |
|---|---|---|---|---|
| 5,930,112 | A * | 7/1999 | Babinski | H02M 7/003 361/695 |
| 6,888,719 | B1 * | 5/2005 | Janzen | H01L 23/367 204/450 |
| 7,177,154 | B2 * | 2/2007 | Lee | G06F 1/181 165/104.33 |
| 7,277,286 | B2 * | 10/2007 | Lee | G06F 1/20 174/15.2 |
| 8,004,836 | B2 * | 8/2011 | Kauranen | H05K 7/20918 165/80.3 |
| 9,155,231 | B2 | 10/2015 | Masuda et al. | |
| 9,801,314 | B2 * | 10/2017 | Kuwabara | H02M 1/143 |
| 10,206,310 | B2 * | 2/2019 | Ukegawa | H05K 7/20509 |
| 2015/0362262 | A1 * | 12/2015 | Sekikawa | F28F 17/005 165/185 |

FOREIGN PATENT DOCUMENTS

| | | |
|---|---|---|
| JP | 2002-185172 A | 6/2002 |
| JP | 2013-120912 A | 6/2013 |
| JP | 2014-138442 A | 7/2014 |
| JP | 2016-013027 A | 1/2016 |
| JP | 2016-167953 A | 9/2016 |

OTHER PUBLICATIONS

Office Action dated Mar. 9, 2020 in Chinese Patent Application No. 201780049531.1, 12 pages.

* cited by examiner

MOTOR DRIVE DEVICE

CROSS-REFERENCE TO RELATED APPLICATIONS

This application is a National Stage Application based on PCT/JP2017/046754, filed on 26 Dec. 2017, the entire contents of which being incorporated herein by reference.

FIELD

The present invention relates to a motor drive device that is provided to a control panel and drives a plurality of motors.

BACKGROUND

A control panel is provided with, for example, a numerical control unit, a machine control circuit, and a motor drive device to control a machine tool such as a machining center, a numerical control (NC) lathe, a laser beam machine, or an electric discharge machine. The motor drive device includes a semiconductor device that supplies electric power to a motor provided to the machine tool. When switching operation of the semiconductor device takes place, the motor is supplied with the electric power and thus operates. The switching operation causes switching loss and conduction loss to the semiconductor device, and because of these losses, the semiconductor device experiences a temperature increase. When the temperature of the semiconductor device exceeds an allowable temperature, the semiconductor device can possibly have its life shortened or be damaged. In order to keep the temperature of the semiconductor device less than or equal to the allowable temperature, the motor drive device includes a cooling mechanism such as a heat radiator or a heat radiation fan.

In cases where a motor drive device is used to drive a plurality of motors, the motor drive device needs to be provided with semiconductor devices that drive the plurality of motors. In other words, that one motor drive device is provided with the plurality of semiconductor devices. In such cases, the plurality of semiconductor devices are heat sources and thus require cooling measures. As described above, the motor drive device that drives the plurality of motors includes the plurality of semiconductor devices and also includes a plurality of cooling mechanisms. Because of including the increased number of cooling mechanisms, the entire motor drive device has an increased size compared with a motor drive device that structurally drives only one motor.

Patent Literature 1 discloses a technique of cooling a plurality of semiconductor devices by means of one heat radiator. A motor drive device described in Patent Literature 1 includes a heat radiator that includes a first heat transfer surface and a second heat transfer surface adjoining the first heat transfer surface, a substrate mounted with semiconductor devices that are provided on the first heat transfer surface, and a substrate mounted with semiconductor devices that are provided on the second heat transfer surface. The first and second heat transfer surfaces of the heat radiator are each in contact with the semiconductor devices, so that the plurality of semiconductor devices can be cooled by that one heat radiator in the motor drive device described in Patent Literature 1.

CITATION LIST

Patent Literature

Patent Literature 1: Japanese Patent Application Laid-open No. 2014-138442

SUMMARY

Technical Problem

The control panel is internally provided with a partition plate. Because of this partition plate, the control panel is internally formed with a ventilation space and a dustproof space. The ventilation space is a space for passage of cooling air that includes particulates such as oil mist or dust. The dustproof space is a space that can provide protection from the particulates that might otherwise enter from the ventilation space. In cases where the motor drive device described in Patent Literature 1 is placed in a control panel having the above structure, not only the heat radiator but also the semiconductor devices and the substrates need to be placed in the ventilation space because the motor drive device described in Patent Literature 1 has the semiconductor devices provided on the two heat transfer surfaces of the heat radiator.

With the semiconductor devices and the substrates thus placed in the ventilation space, particulates adhere to, for example, the semiconductor devices and a circuit provided on the substrate, so that insulation failure, corrosion, and others can possibly take place, thus leading to failure of the motor drive device. For the purpose of preventing the particulates from adhering to the semiconductor devices and the substrates, the motor drive device described in Patent Literature 1 requires one of measures including treatment of each of the semiconductor devices and the substrates with a special coating and addition of dustproof members that each prevent the particulates from entering a clearance between the heat radiator and the substrate. As a result, the motor drive device becomes structurally complicated, and maintainability of the semiconductor devices and the substrates problematically reduces.

In view of the above, the present invention aims to obtain a motor drive device that structurally drives a plurality of motors and is susceptible of structural simplification and reduction in size.

Solution to Problem

To solve the above-stated problem and to achieve the object, a motor drive device according to the present invention is provided to a control panel, drives a plurality of motors, and includes a first heat radiation part that is plate-shaped and includes a first plate surface and a second plate surface that is a reverse surface opposite from the first plate surface. The motor drive device also includes a second heat radiation part and a first heat generating element that drives a first motor and is thermally connected to the second heat radiation part. The second heat radiation part is plate-shaped, is thermally connected to the first plate surface, includes a third plate surface, and is provided with a first normal to the third plate surface intersecting a second normal to the first plate surface. The motor drive device also includes a second heat generating element that drives a second motor and is thermally connected to the first plate surface, and a third heat radiation part that is thermally connected to the second plate surface.

Advantageous Effects of Invention

According to the present invention, the motor drive device that structurally drives the plurality of motors has the effect of being susceptible of structural simplification and reduction in size.

DESCRIPTION OF EMBODIMENT

With reference to the drawings, a detailed description is hereinafter provided of a motor drive device according to an embodiment of the present invention. It is to be noted that this embodiment is not restrictive of the present invention.

Embodiment

Figure 1:
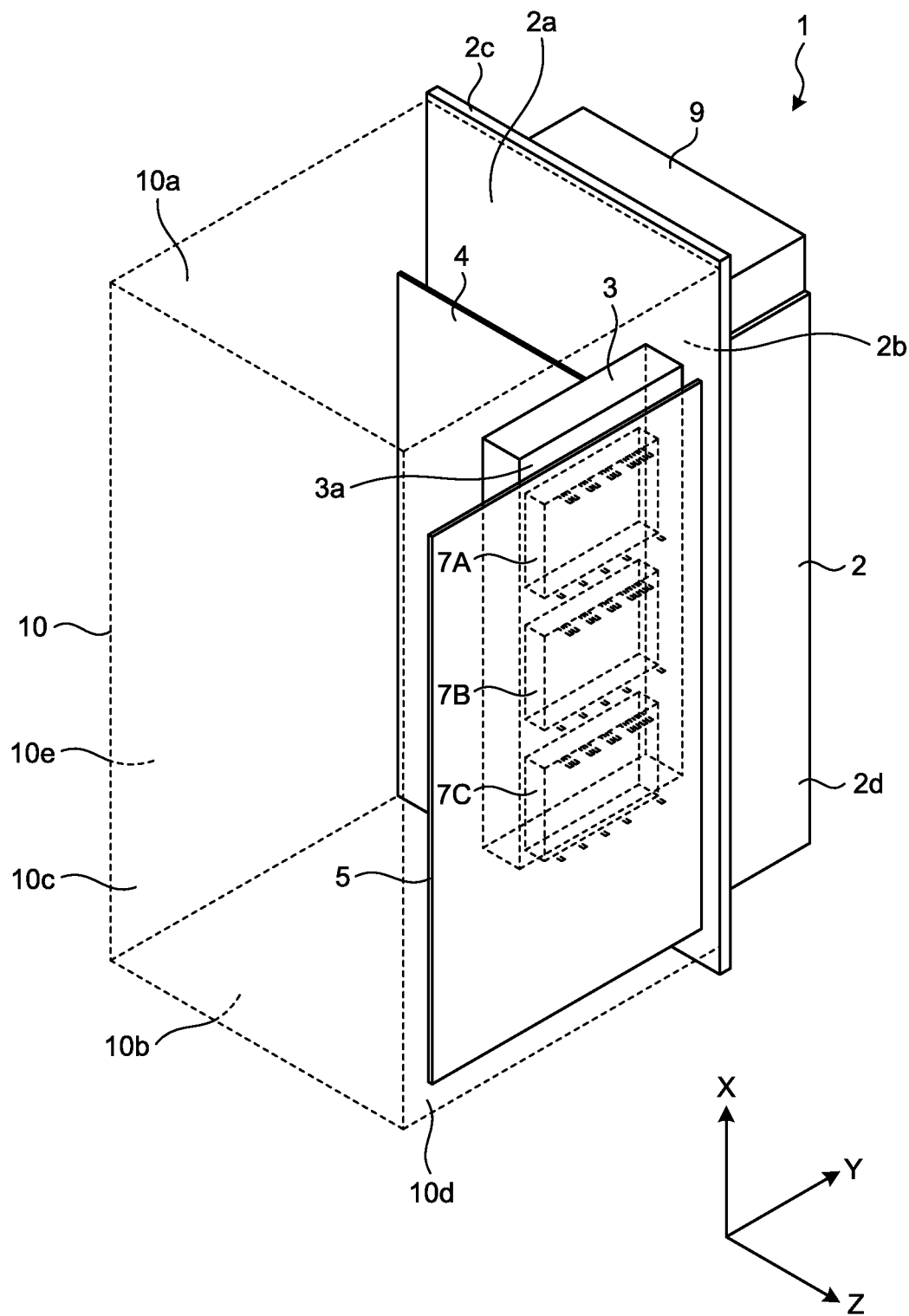
FIG. 1 is a first perspective view of a motor drive device according to an embodiment of the present invention.
Figure 2:
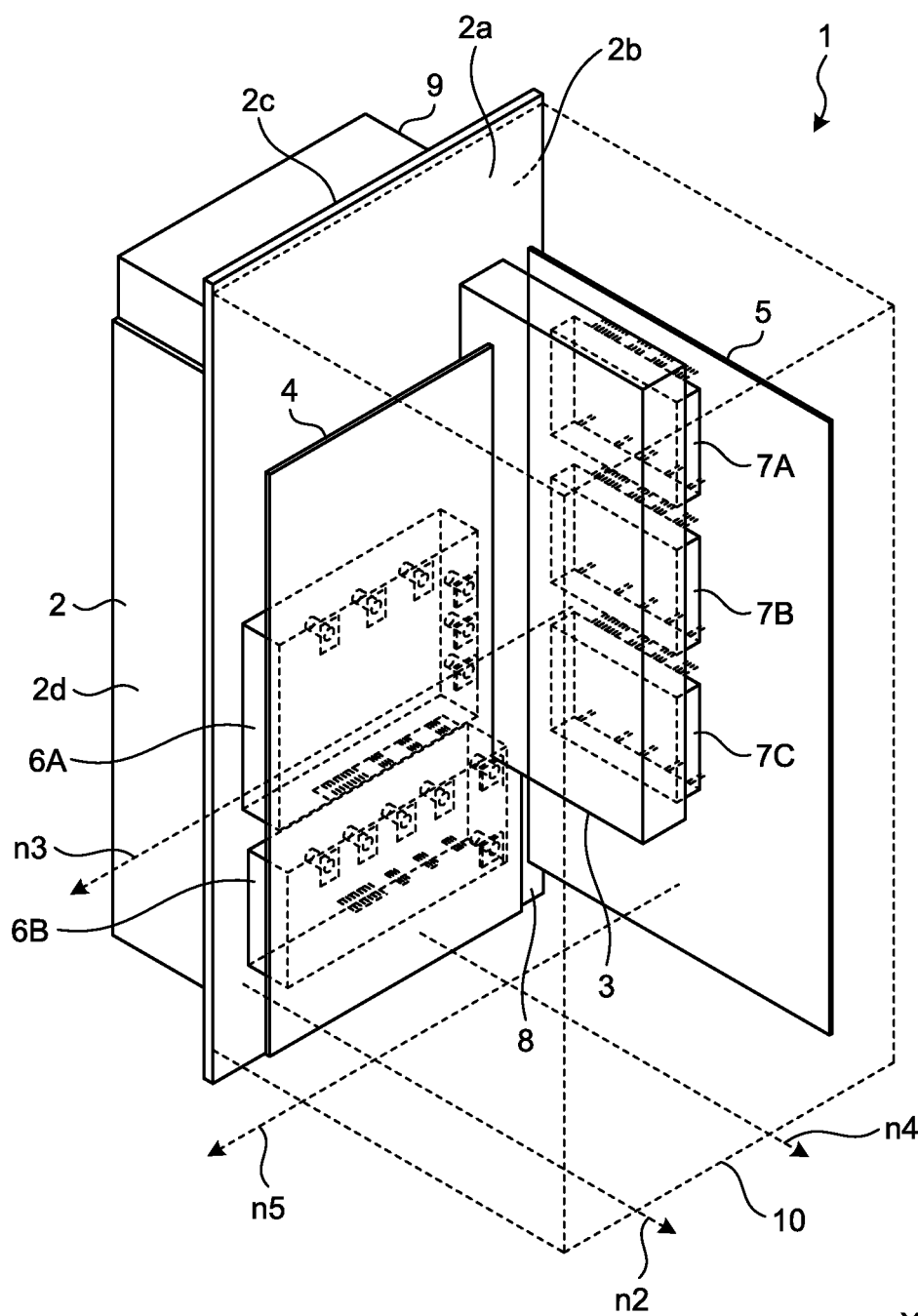
FIG. 2 is a second perspective view of the motor drive device according to the embodiment of the present invention.
Figure 2:
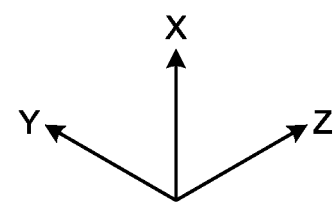
Figure 3:
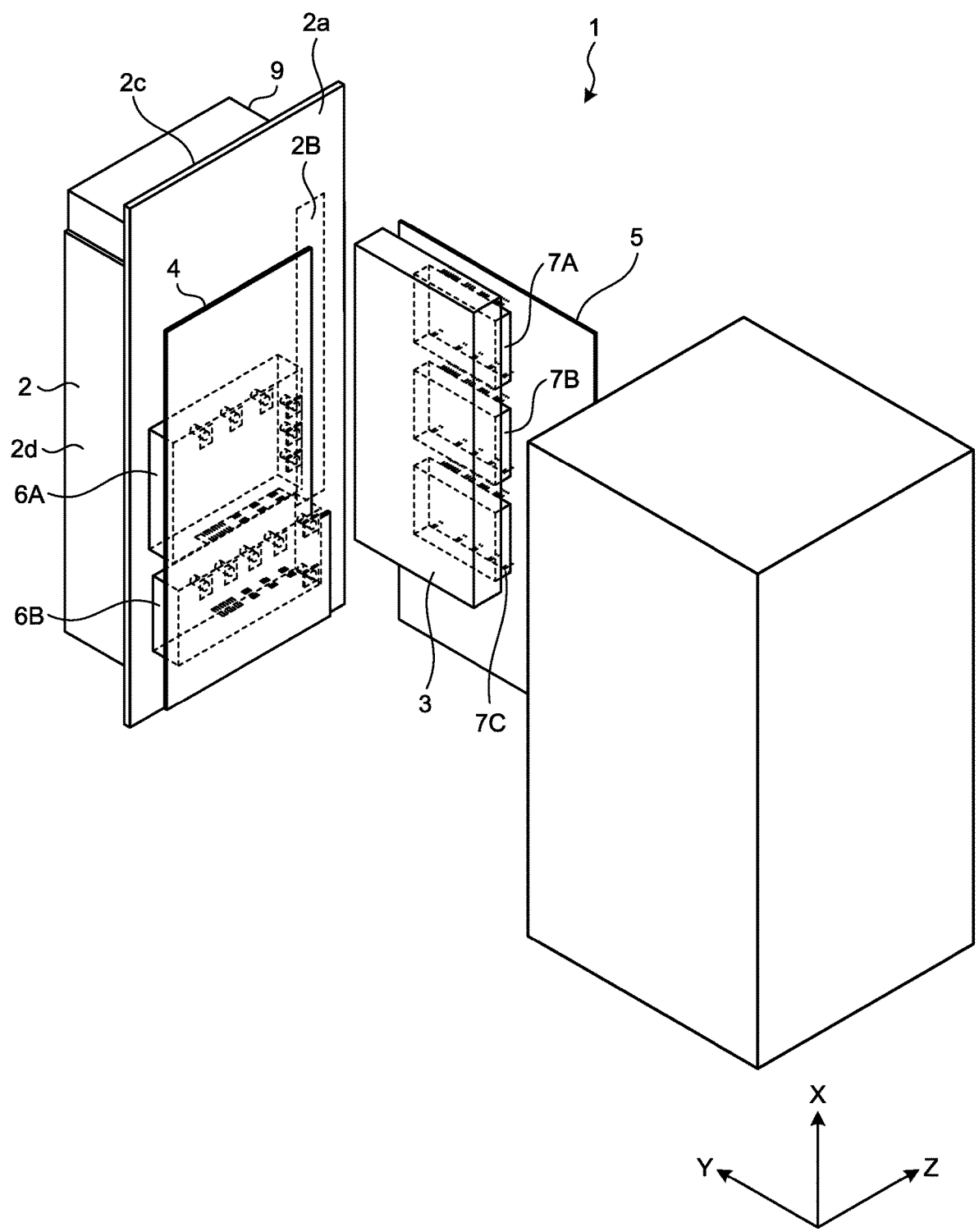
FIG. 3 is an exploded perspective view of the motor drive device illustrated in FIG. 1.
Figure 4:
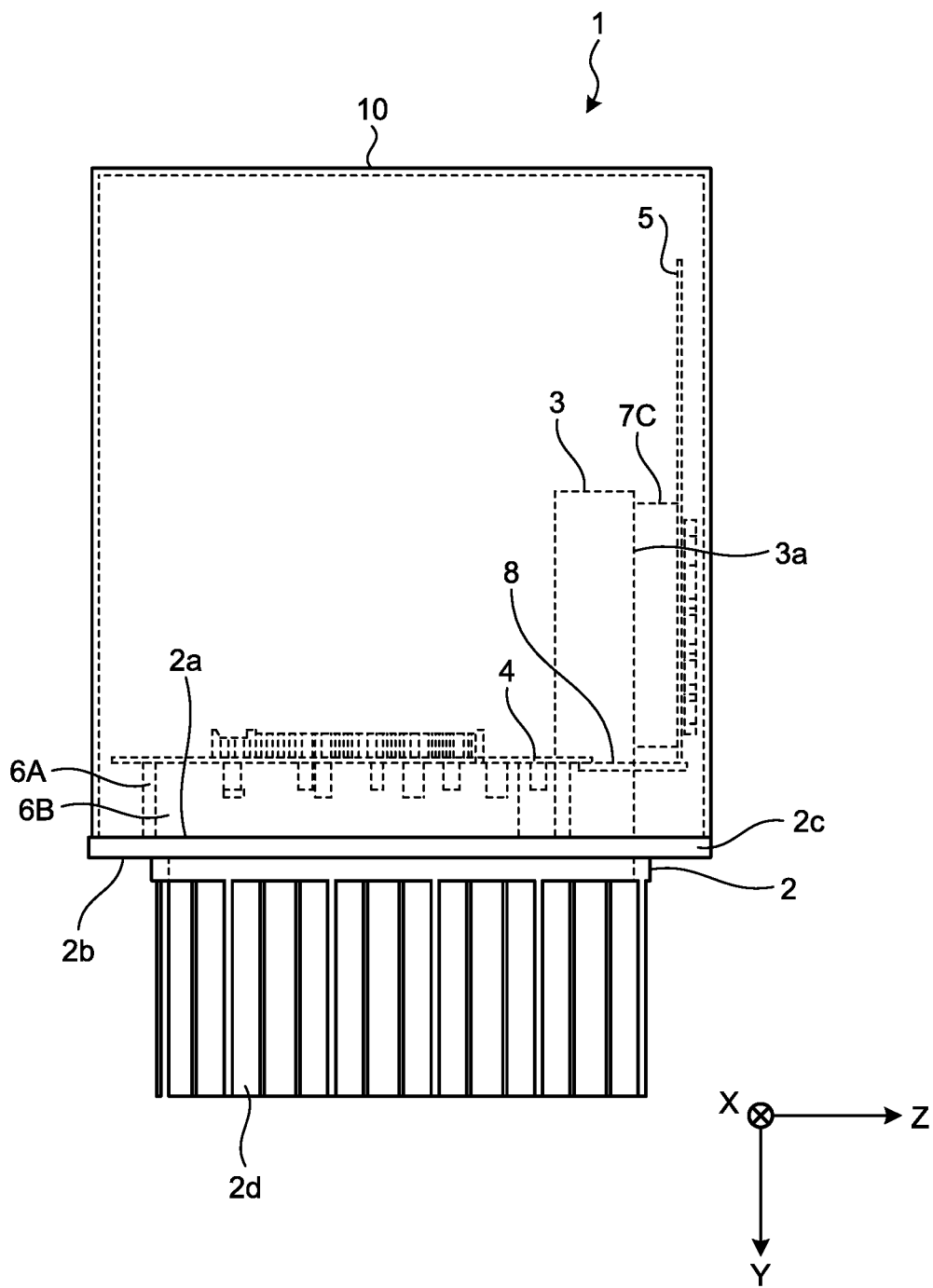
FIG. 4 is a bottom view of a housing and a heat radiator that are illustrated in FIG. 1.

FIG. 1 is a first perspective view of the motor drive device according to the embodiment of the present invention. FIG. 2 is a second perspective view of the motor drive device according to the embodiment of the present invention. FIG. 3 is an exploded perspective view of the motor drive device illustrated in FIG. 1. FIG. 4 is a bottom view of a housing and a heat radiator that are illustrated in FIG. 1. The motor drive device 1 is a device that drives a plurality of motors provided to a machine tool such as a machining center, an NC lathe, a laser beam machine, or an electric discharge machine. While a description provided in the present embodiment is of a structural example of the motor drive device 1 that drives four motors, the motors only have to be two or more in number and thus are not limited to four in number.

The motor drive device 1 includes the housing 10, a substrate 5 that is provided in the housing 10 and is provided with a circuit, and a plurality of semiconductor devices 7A, 7B, and 7C that are provided on the substrate 5 and are included in the circuit to supply electric power to a first motor. In the following description, there are cases where the plurality of semiconductor devices 7A, 7B, and 7C are simply referred to as "semiconductor devices 7". The plurality of semiconductor devices 7A, 7B, and 7C correspond to, for example, a semiconductor device group that drive three servomotors which in turn drive three feed shafts provided to a numerical control unit. The first motor corresponds to, for example, one of these servomotors.

The motor drive device 1 also includes a heat radiator 3 that is provided in the housing 10 and is mechanically and thermally connected to the semiconductor devices 7A, 7B, and 7C, and a substrate 4 that is provided in the housing 10 and is provided with a circuit for supplying electric power to a second motor. The motor drive device 1 also includes a plurality of semiconductor devices 6A and 6B that are provided on the substrate 4 and are included in the circuit to supply the electric power to the second motor. The second motor corresponds to, for example, a motor that drives a main spindle provided to the numerical control unit. The semiconductor device 6A corresponds to a semiconductor device that drives the motor which in turn drives the main spindle. The semiconductor device 6B corresponds to, for example, a semiconductor device for a rectifier that supplies direct-current power to the plurality of semiconductor devices 7A, 7B, and 7C and the semiconductor device 6A. In the following description, there are cases where the plurality of semiconductor devices 6A and 6B are simply referred to as "semiconductor devices 6".

The motor drive device 1 also includes a heat radiator 2 that is mechanically and thermally connected to the heat radiator 3 and the semiconductor devices 6, a fan 9 that performs forced air cooling of the heat radiator 2, and a connecting member 8 providing electrical connection between the circuit on the substrate 5 and the circuit on the substrate 4.

In a left-handed XYZ coordinate system of FIG. 1, the substrate 5, the heat radiator 3, and the substrate 4 are arranged along a Z-axis, and those orthogonal to the Z-axis are a Y-axis along which the heat radiator 2 and the substrate 4 are arranged and an X-axis which is also orthogonal to the −Y axis. The X-axis corresponds with a vertical width of the motor drive device 1 and a vertical direction. The Y-axis corresponds with a depth of the motor drive device 1 and a horizontal direction. The Z-axis corresponds with a horizontal width of the motor drive device 1 and the horizontal direction. Also other drawings have the above axes.

The housing 10 is formed of five plates that meet at right angles. The housing 10 is a pentahedron having the shape of a bottomed box with all the five plates meeting at right angles. Among the five plates, the plate positioned in one X-axis direction is a ceiling plate 10a, the plate positioned in another X-axis direction is a bottom plate 10b, the plate positioned in a Y-axis direction is a front plate 10c, the plate positioned in one Z-axis direction is a side plate 10d, and the plate positioned in another Z-axis direction is a side plate 10e.

Metals can be given as examples of a material for the housing 10 and include a copper alloy, cast iron, steel, an iron alloy, an aluminum alloy, and an austenitic stainless alloy. It is to be noted that the material for the housing 10 is not limited to the metals and may be an insulating resin such as polybutylene terephthalate, polyphenylene sulfide or a liquid crystal polymer.

A shape defined by outlines of the housing 10 is not limited to a rectangular parallelepiped having a greater vertical width dimension than a horizontal width dimension and may be, for example, a rectangular parallelepiped having a smaller vertical width dimension than a horizontal width dimension or a rectangular parallelepiped having a vertical width dimension equal to a horizontal width dimension.

The housing 10 is fixed to a fin base 2c of the heat radiator 2. The fin base 2c is a first heat radiation part. The housing 10 may be fixed to the fin base 2c by means of screws that are screwed into the fin base 2c or by being welded at contact part of the housing 10 with the fin base 2c. A detailed description of structure of the heat radiator 2 is provided later.

In the housing 10, the substrate 5, the semiconductor devices 7, and the heat radiator 3 are arranged in this order in a direction from the side plate 10d toward the side plate 10e. In the housing 10, the semiconductor devices 6 and the substrate 4 are arranged in this order in a direction from the fin base 2c toward the front plate 10c.

The substrate 5 is a printed board provided with the circuit that is necessary for driving of the first motor. When a Y-Z plane is viewed along the X-axis, the substrate 5 is provided with a normal n5 to a substrate surface of the substrate 5 being orthogonal to a normal n2 to a first plate surface 2a of the fin base 2c. It is to be noted that the normal n5 and the normal n2 only have to intersect each other and thus are not limited to the orthogonal relationship.

The substrate 5 is provided near the side plate 10d with its substrate surface closer to the side plate 10d being parallel to the side plate 10d. A clearance is formed between the substrate surface of the substrate 5 closer to the side plate 10d and the side plate 10d. It is to be noted that "parallel" is meant to include a range that has taken into account manufacturing tolerances for components of the motor drive device 1, variations in assembly of the components, and others.

The substrate 5 is provided with the semiconductor devices 7 at its substrate surface opposite from the substrate surface closer to the side plate 10d. The substrate 5 is formed with a copper foil as a wiring pattern, and the semiconductor devices 7 are electrically connected to the copper foil.

Each of the semiconductor devices 7A, 7B, and 7C is, for example, a power module including semiconductors. A power module includes a plurality of power devices and a package formed of insulating resin that exteriorly covers the plurality of power devices. The power devices include a transistor and a diode. An inverter module, a converter module, and others are kinds of power modules.

A control pin of the semiconductor device 7 is connected to the wiring pattern of the substrate 5 by soldering or via a connector. Between a control pin and a wiring pattern, transmission of a signal that effects switching operation of a switching element and transmission of electric power from the switching element to a motor, for example are made.

The semiconductor devices 7A, 7B, and 7C are arranged in spaced relation along the X-axis. The semiconductor devices 7 each have an opposite end face from an end face closer to the substrate 5, and that opposite end face is in contact with a plate surface 3a of the heat radiator 3 closer to the substrate 5. As such, the semiconductor devices 7 are thermally connected to the heat radiator 3. It is to be noted that the plate surface 3a is a surface that receives heat generated by the semiconductor devices 7.

The semiconductor devices 7 are fixed to the heat radiator 3 by means of, for example, screws that are screwed into the heat radiator 3 through the substrate 5 and the semiconductor devices 7.

It is to be noted that fixing of the semiconductor devices 7 to the heat radiator 3 only has to enable thermal connection of the semiconductor devices 7 to the heat radiator 3 and thus is not limited to the above method. The semiconductor devices 7 are not limited to three in number. The number of semiconductor devices 7 only has to be one or more. In cases where only the semiconductor device 7A is used among the semiconductor devices 7A, 7B, and 7C, the semiconductor device 7A is a first heat generating element.

The heat radiator 3 is a second heat radiation part having the shape of a square or rectangular plate with four interior angles being right angles. Metals can be given as examples of a material for the heat radiator 3 and include aluminum, an austenitic stainless alloy, a copper alloy, cast iron, steel, and an iron alloy. The heat radiator 3 may be fixed to the fin base 2c by means of, for example, screws that are screwed into the fin base 2c and the heat radiator 3 or by being welded at contact part of the heat radiator 3 with the fin base 2c.

When the Y-Z plane is viewed along the X-axis, the heat radiator 3 is provided with a normal n3 to a third plate surface of the heat radiator 3 that is opposite from the plate surface closer to the substrate 5 being orthogonal to the normal n2 to the first plate surface 2a of the fin base 2c. The normal n3 is a first normal. The normal n2 is a second normal. It is to be noted that the normal n3 and the normal n2 only have to intersect each other and thus are not limited to the orthogonal relationship.

By being fixed to the fin base 2c, the heat radiator 3 is mechanically and thermally connected to the fin base 2c. With the heat radiator 3 fixed to the fin base 2c, the substrate 5 and the semiconductor devices 7 are fixed to the fin base 2c via the heat radiator 3, and the semiconductor devices 7 are thermally connected to the fin base 2c.

It is to be noted that the heat radiator 3 is not limited to the plate-shaped member and may be, for example, a combination of a fin base that has the shape of a rectangular plate, and a plurality of fins that are provided to that fin base. The heat radiator 3 may be made by machining or by die casting by which the fin base and the fins are molded integrally.

The substrate 4 is a printed board provided with the circuit that is necessary for driving of the second motor. When the Y-Z plane is viewed along the X-axis, the substrate 4 is provided with a normal n4 to a substrate surface of the substrate 4 being orthogonal to the normal n5 to the substrate surface of the substrate 5. It is to be noted that the normal n4 and the normal n5 only have to intersect each other and thus are not limited to the orthogonal relationship.

The substrate 4 is provided near the fin base 2c with the normal n4 to the substrate surface of the substrate 4 being parallel to the normal n2 to the first plate surface 2a of the fin base 2c. A clearance is formed between a substrate surface of the substrate 4 closer to the fin base 2c and the fin base 2c.

The substrate 4 is provided with the semiconductor devices 6 at its fin-base-end substrate surface. The substrate 4 is formed with a copper foil as a wiring pattern, and the semiconductor devices 6 are electrically connected to the copper foil.

The substrate 4 may be fixed to the fin base 2c by means of a columnar member that is provided between the substrate 4 and the fin base 2c and screws that are screwed into the columnar member or by means of screws that are screwed into the fin base 2c through the substrate 4 and the semiconductor devices 6.

Each of the semiconductor devices 6A and 6B is a component that generates heat when driving the second motor and is, for example, a step-up transformer, a reactor, a resistor, or a power module including semiconductors. It is to be noted that the semiconductor devices 6 only have to be components that require cooling by the heat radiator 2 and thus are not limited to these components.

A control pin of the semiconductor device 6 is connected to the wiring pattern of the substrate 4 by soldering or via a connector. Between a control pin and a wiring pattern, transmission of a signal that effects switching operation of a switching element and transmission of electric power from the switching element to a motor, for example are made.

The semiconductor devices 6A and 6B are arranged in spaced relation along the X-axis. The semiconductor devices 6 each have an opposite end face from an end face closer to the substrate 4, and that opposite end face is in contact with the fin base 2c. As such, the semiconductor devices 6 are thermally connected to the heat radiator 2.

It is to be noted that fixing of the semiconductor devices 6 to the fin base 2c only has to enable thermal connection of the semiconductor devices 6 to the fin base 2c and thus is not limited to the above-stated method. The semiconductor devices 6 are not limited to two in number. The number of semiconductor devices 6 only has to be one or more. In cases where only one of the semiconductor devices 6A and 6B, namely, the semiconductor device 6A is used, the semiconductor device 6A is a second heat generating element.

The structure of the heat radiator 2 is described next. The heat radiator 2 includes the fin base 2c that has the shape of a rectangular plate, and fins 2d that form a third heat radiation part provided to the fin base 2c. It is to be noted that the heat radiator 2 may be made by machining or by die casting by which the fin base 2c and the fins 2d are molded integrally.

Metals can be given as examples of a material for the heat radiator 2 and include aluminum, an austenitic stainless alloy, a copper alloy, cast iron, steel, and an iron alloy.

The fin base 2c is not limited to the rectangular shape and may be square-shaped. The fin base 2c only has to be a plate-shaped member that is large enough to close an opening formed in the housing 10 and thus may have the shape of a polygon other than a quadrilateral.

The fin base 2c includes the first plate surface 2a of the fin base 2c that is closer to the housing 10, and a second plate surface 2b of the fin base 2c. The second plate surface 2b is a reverse surface opposite from the first plate surface 2a.

The first plate surface 2a of the fin base 2c is a surface that receives heat generated by the semiconductor devices 6 and also receives heat generated by the semiconductor devices 7. The heat radiator 3 and the semiconductor devices 6 are mechanically and thermally connected to the first plate surface 2a of the fin base 2c. In FIG. 3, an area 2B indicated by a dotted line in the first plate surface 2a is a part that makes contact with a Y-axis end of the heat radiator 3 closer to the fin base 2c.

It is to be noted that in cases where the fin base 2c is mechanically warped or in cases where the first plate surface 2a of the fin base 2c or the end of the heat radiator 3 closer to the fin base 2c has irregularities, air space is defined between the heat radiator 3 and the fin base 2c. In other words, the air space is defined in a conduction path for heat that is generated by the semiconductor devices 7. This air space increases thermal contact resistance, so that a cooling effect on the semiconductor devices 7 is smaller.

To suppress such increase of thermal contact resistance, application of a thermal grease may be carried out between the heat radiator 3 and the fin base 2c, or a heat transfer member may be provided between the heat radiator 3 and the fin base 2c. The heat transfer member is, for example, an insulating sheet of high thermal conductivity. Specifically, the heat transfer member is made by inclusion of, by mixing, particles of high thermal conductivity or powder that has higher thermal conductivity than a material for the fin base 2c has in an insulating sheet. Given examples of a material for the insulating sheet include silicone rubber, polyisobutylene rubber, and acrylic rubber. Given examples of materials for the particles and the power that have the high thermal conductivity include an aluminum oxide, an aluminum nitride, a zinc oxide, silica, and mica.

With the thermal grease applied or the heat transfer member provided between the heat radiator 3 and the fin base 2c, increase of thermal contact resistance is suppressed, so that the heat radiator 2 has an improved cooling effect on the semiconductor devices 7.

Another alternative is that the heat radiator 3 may be connected to the fin base 2c of the heat radiator 2 by welding. Compared with connection that is established without welding, the connection established by welding decreases the thermal contact resistance between the heat radiators 3 and 2, whereby an improved cooling effect is achieved on the semiconductor devices 7.

While the substrate 5 and the heat radiator 3 are provided at right angles to the first plate surface 2a of the fin base 2c, it is to be noted that the substrate 5 and the heat radiator 3 only have to be provided in an area obtained by projection of the fin base 2c in the direction of the substrate 4 and thus may each be provided at an angle slightly different from the right angle with respect to the first plate surface 2a of the fin base 2c. For example, the angle formed by the first plate surface 2a of the fin base 2c and the substrate surface of the substrate 5 may be an angle other than 90°, ranging, for example, from 80° to 100°, inclusive. Likewise, the angle formed by the first plate surface 2a of the fin base 2c and the plate surface of the heat radiator 3 may be an angle other than 90°, ranging, for example, from 80° to 100°, inclusive.

The second plate surface 2b of the fin base 2c is a surface that transfers heat of the fin base 2c to the fins 2d. The fins 2d are mechanically and thermally connected to the second plate surface 2b of the fin base 2c. It is to be noted that the fins 2d only have to be shaped to achieve an increased heat dissipation area for the heat radiator 2 and may be, for example, a plurality of plate-shaped members arranged in spaced relation along the Z-axis or a quadrilateral member formed with an uneven outer peripheral surface by processing.

The fan 9 is provided above the fins 2d. The fan 9 is a blower mechanism that performs forced air cooling of the fin base 2c. In cases where temperature elevation of the semiconductor devices 7 and the semiconductor devices 6 can be suppressed solely by the fins 2d, the fan 9 is not necessary.

The fins 2d and the fan 9 are provided in an area obtained by projection of the fin base 2c in the direction of the fins 2d and the fan 9. This enables fixing of the fin base 2c to a partition plate of a control panel. A detailed description of a method of fixing the fin base 2c to the partition plate of the control panel is provided later.

The connecting member 8 is, for example, a connector, a harness, or a terminal block to electrically connect the wiring pattern of the substrate 5 to the wiring pattern of the substrate 4. Through the connecting member 8, signals are transmitted between the circuit on the substrate 4 and the circuit on the substrate 5.

In the motor drive device 1 having the above structure, the substrate 4, the substrate 5, the semiconductor devices 6, and the semiconductor devices 7 are placed in a space surrounded by the housing 10 and the fin base 2c, while the fins 2d are placed outside that space. In the following description, that space is referred to as an interior of the housing, and the outside of the space is referred to as the outside of the housing. While the motor drive device 1 illustrated in FIGS. 1 to 4 uses the substrates 4 and 5 that are two in number, three or more substrates may be used as long as those two substrates 4 and 5 are included.

A description is provided next of a path along which heat generated at the motor drive device 1 is conducted. An internal temperature of the housing is elevated by heat that is generated by the semiconductor devices 6 and 7 and heat that is generated by the respective circuits of the substrates 4 and 5 and thus becomes higher than a temperature of the outside of the housing. Heat moves from a place of high temperature to a place of lower temperature. In order for a highly heated semiconductor device or the like to have a lowered temperature, a housing needs to radiate its internal heat out of the housing.

The heat generated by the semiconductor devices 6 making contact with the fin base 2c of the heat radiator 2 is conducted to the fins 2d by way of the fin base 2c to be radiated out of the housing from the fins 2d. The heat generated by the semiconductor devices 7 making contact with the heat radiator 3 is conducted to the fins 2d by way of the heat radiator 3 and the fin base 2c to be radiated out of the housing from the fins 2d.

Because of being conducted to the heat radiator 2, the heat generated by the semiconductor devices 6 is partially conducted to the heat radiator 3 by way of the heat radiator 2. Accordingly, the heat radiator 3 has a higher temperature than when it is only heat generated by the semiconductor device 7 that is conducted to the heat radiator 3. Heat of the heat radiator 3 thus highly heated is conducted to the semiconductor devices 7 which, in turn, are heated to higher temperatures than when no heat is generated by the semiconductor devices 6. For the purpose of suppressing such temperature elevation of the semiconductor devices 7, a method of increasing heat capacity of the heat radiator 2 is conceivable to enhance heat transfer from the heat radiator 3 to the heat radiator 2.

In cases where the semiconductor devices 6 and the semiconductor devices 7 are power modules each including a plurality of power devices, heat transfer paths each start from the power devices and ends at the outside of the housing by way of a package surface of the power module and the heat radiator(s) in this order. In the present embodiment, heat that is conducted from the power devices to the package surface of the power module is dealt with as heat generated by each of the semiconductor devices 6 and 7. As such, with the semiconductor devices 6 and 7 being the power modules each including the plurality of power devices, the description of the present embodiment includes the heat transfer path that starts from the semiconductor devices 6 and ends at the outside of the housing by way of the heat radiator, and the heat transfer path that starts from the semiconductor devices 7 and ends at the outside of the housing by way of the heat radiators.

A flow of heat from the semiconductor device can be explained by Ohm's law used in electrical circuits by replacement of power losses caused at each of the semiconductor devices 6 and 7 with current, replacement of thermal resistance with electrical resistance, and replacement of a temperature difference with an electric potential difference. The thermal resistance is a measurement of resistance to heat flow and represents a temperature rise when a unit of heat is generated in unit time. Heat dissipation improves as the thermal resistance decreases. A unit of thermal resistance is "° C./W".

Figure 5:
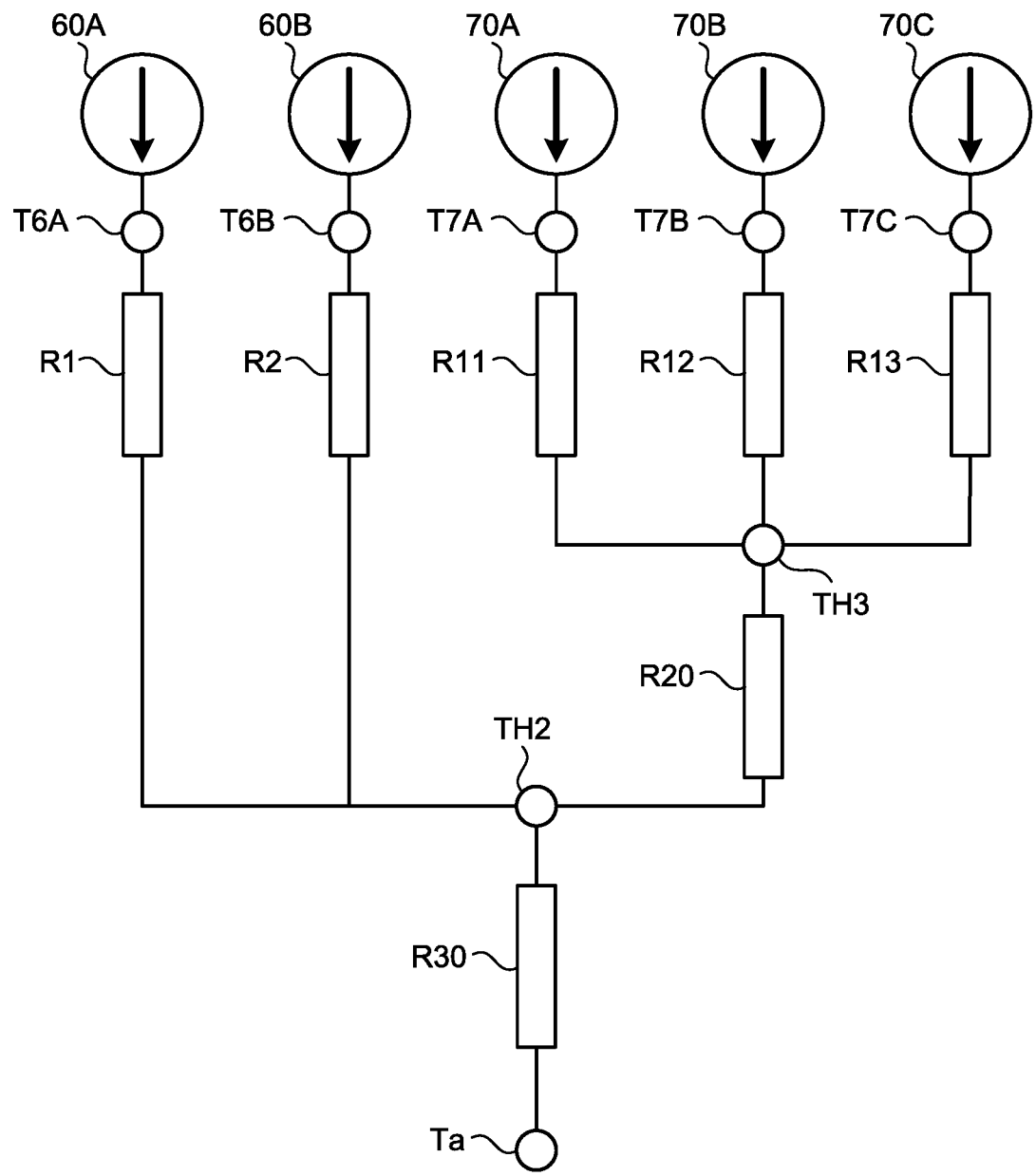
FIG. 5 illustrates a heat conduction model of the motor drive device illustrated in FIG. 1.

FIG. 5 illustrates a heat conduction model of the motor drive device illustrated in FIG. 1. In the FIG. 5 heat conduction model, the semiconductor devices that are sources of heat generation are considered as power loss sources. Specifically, in FIG. 5, the semiconductor devices 6A and 6B are considered as a power loss source 60A and a power loss source 60B, respectively, while the semiconductor devices 7A, 7B, and 7C are considered as a power loss source 70A, a power loss source 70B, and a power loss source 70C, respectively.

Thermal resistance R1 represents thermal resistance between the heat radiator 2 and the semiconductor device 6A. Thermal resistance R2 represents thermal resistance between the heat radiator 2 and the semiconductor device 6B. Thermal resistance R11 represents thermal resistance between the heat radiator 3 and the semiconductor device 7A. Thermal resistance R12 represents thermal resistance between the heat radiator 3 and the semiconductor device 7B. Thermal resistance R13 represents thermal resistance between the heat radiator 3 and the semiconductor device 7C. Thermal resistance R20 represents thermal resistance between the heat radiator 2 and the heat radiator 3. Thermal resistance R30 represents thermal resistance between the heat radiator 2 and air surrounding the heat radiator 2.

The power loss source 60A is connected to one end of the thermal resistance R1. Temperature T6A represents temperature at this connecting point and is equivalent to temperature of the semiconductor device 6A that generates heat. The power loss source 60B is connected to one end of the thermal resistance R2. Temperature T6B represents temperature at this connecting point and is equivalent to temperature of the semiconductor device 6B that generates heat. The power loss source 70A is connected to one end of the thermal resistance R11. Temperature T7A represents temperature at this connecting point and is equivalent to temperature of the semiconductor device 7A that generates heat. The power loss source 70B is connected to one end of the thermal resistance R12. Temperature T7B represents temperature at this connecting point and is equivalent to temperature of the semiconductor device 7B that generates heat. The power loss source 70C is connected to one end of the thermal resistance R13. Temperature T7C represents temperature at this connecting point and is equivalent to temperature of the semiconductor device 7C that generates heat.

Another end of the thermal resistance R11, another end of the thermal resistance R12, and another end of the thermal resistance R13 are connected to one end of the thermal resistance R20. Temperature TH3 represents temperature at this connecting point.

Another end of the thermal resistance R1, another end of the thermal resistance R2, and another end of the thermal resistance R20 are connected to one end of the thermal resistance R30. Temperature TH2 represents temperature at this connecting point and is equivalent to temperature of the heat radiator 2.

Temperature at another end of the thermal resistance R30 is represented as ambient temperature Ta. The ambient temperature Ta is equivalent to temperature of the air surrounding the heat radiator 2.

Using the FIG. 5 heat conduction model, a description is hereinafter provided of an example of calculation of the respective temperatures of the heat radiators 2 and 3, the semiconductor devices 6A and 6B, and the semiconductor devices 7A, 7B, and 7C. In the following description, the power losses caused at the semiconductor device 6A are represented by P6A, the power losses caused at the semiconductor device 6B are represented by P6B, the power losses caused at the semiconductor device 7A are represented by P7A, the power losses caused at the semiconductor device 7B are represented by P7B, and the power losses caused at the semiconductor device 7C are represented by P7C.

The temperature TH2 of the heat radiator 2 can be calculated by Formula (1). In Formula (1), the calculation of the temperature TH2 of the heat radiator 2 is based on the ambient temperature Ta.

$$TH2=(P6A+P6B+P7A+P7B+P7C)\times R30+Ta \quad (1)$$

The temperature TH3 of the heat radiator 3 can be calculated by Formula (2):

$$TH3=(P7A+P7B+P7C)\times R20+TH2 \quad (2)$$

The temperature TGA of the semiconductor device 6A can be calculated by Formula (3):

$$T6A=P6A\times R1+TH2 \quad (3)$$

The temperature T6B of the semiconductor device 6B can be calculated by Formula (4):

$$T6B=P6B\times R2+TH2 \quad (4)$$

The temperature T7A of the semiconductor device 7A can be calculated by Formula (5):

$$T7A=P7A\times R11+TH3 \quad (5)$$

The temperature T7B of the semiconductor device 7B can be calculated by Formula (6):

$$T7B=P7B\times R12+TH3 \quad (6)$$

The temperature T7C of the semiconductor device 7C can be calculated by Formula (7):

$$T7C=P7C\times R13+TH3 \quad (7)$$

As can be seen from FIG. 5 and Formulas (1) to (7), the temperatures of the components are associated with the ambient temperature Ta<the temperature TH2 of the heat radiator 2<the temperature TH3 of the heat radiator 3. Moreover, the temperatures of the semiconductor devices 6 are influenced by the temperature TH2 of the heat radiator 2, while the temperatures of the semiconductor devices 7 are influenced by the temperature TH2 of the heat radiator 2 and the temperature TH3 of the heat radiator 3. Therefore, in order to lower the temperatures of the semiconductor devices 6, the heat radiator 2 needs to have its temperature TH2 lowered, and in order to lower the temperatures of the semiconductor devices 7, the heat radiators 2 and 3 need to have their respective temperatures TH2 and TH3 lowered.

In cases where an aim is, for example, to lower the temperatures of the semiconductor devices 7 while keeping the temperatures of the semiconductor devices 6 less than or equal to the allowable temperatures of the semiconductor devices 6, reduction of the thermal resistances R11 to R13 shown in Formulas (5) to (7) is conceivable. Increasing volume of the heat radiator 3, for example increases heat capacity of the heat radiator 3 and thus enables relative reductions of the thermal resistances. However, the motor drive device 1 has the heat radiator 3 in the housing 10. For this reason, the increased volume of the heat radiator 3 is undesirable in terms of effective utilization of an internal equipment installation space of the housing 10.

Increasing volume of the heat radiator 2, particularly volume of the fins 2d relative to the volume of the heat radiator 3 increases the heat capacity of the heat radiator 2, so that the temperature TH2 of the heat radiator 2 becomes lower than before the volume increase of the heat radiator 2. Moreover, a difference between the temperature TH2 of the heat radiator 2 and the temperature TH3 of the heat radiator 3 becomes smaller than before the volume increase of the heat radiator 2. Accordingly, elevation of the temperature TH3 of the heat radiator 3 is suppressed. Thus, the temperature TH3 of the heat radiator 3 is lower than before the volume increase of the heat radiator 2. As such, a degree of heat transfer from the heat radiator 3 to the semiconductor devices 7 is smaller than before the volume increase of the heat radiator 2, whereby temperature elevation of the semiconductor devices 7 is suppressed.

With the volume of the heat radiator 2 thus increased relative to the volume of the heat radiator 3, the temperature elevation of the semiconductor devices 7 can be suppressed without volume increase of the heat radiator 3. Moreover, increased flexibility is effected in internal equipment layout of the housing 10 because the internal equipment installation space of the housing 10 is not reduced. With the volume of the heat radiator 2 increased, a degree of heat transfer from the semiconductor devices 6 to the heat radiator 2 is larger than before the volume increase of the heat radiator 2 relative to the volume of the heat radiator 3, so that temperature elevation of the semiconductor devices 6 is suppressed. In cases where the semiconductor devices 6 and 7 are power modules, because of the suppressed temperature elevation of the semiconductor devices 6 and 7, junction temperature elevation of power devices is suppressed in the power module, and the power devices can be driven at high speeds accordingly, enabling the motor drive device 1 to have a higher output.

A description is provided next of a case where the motor drive device 1 according to the present embodiment is used as a device that drives motors mounted in a machine tool.

Including the main spindle and the three feed shafts that are driven by the servomotors, the numerical control unit requires three semiconductor devices that drive the servomotors, one semiconductor device that drives the main spindle motor, and one semiconductor device for the rectifier that converts alternating-current power from a plant power source to direct-current power to supply the direct-current power to these four semiconductor devices. The numerical control unit including the three feed shafts and the main spindle thus requires five semiconductor devices in total.

The feed shafts are used, for example, in a positioning operation and a cutting feed operation during contour machining. The main spindle is mounted with a tool and finds direct use in machining of a workpiece. As such, a heavy load is applied to the main spindle. Moreover, increase in output of the servomotors and increase in output of the main spindle motor are associated with increase of electric power supply from the motor drive device 1 to the motors. Associated with these output increases of the motors, increased current is passed through the semiconductor device that is used for the rectifier.

As stated above, the main spindle finds direct use in machining of a workpiece, and associated with output increases of the motors, increased current is passed through the semiconductor device that is used for the rectifier. As such, in cases where the motor drive device 1 is used for the numerical control unit, some of the semiconductor devices in the motor drive device 1 experience passage of a larger current compared with the semiconductor devices that drive the servomotors. Therefore, a semiconductor device having a large current capacity is generally used as the semiconductor device that drives the main spindle motor, the semiconductor device that is used for the rectifier, or the like.

In cases where, for example, the semiconductor device 6A and the semiconductor device 6B are used as the semiconductor device that drives the main spindle motor and the semiconductor device that is used for the rectifier, respectively, and the semiconductor devices 7A, 7B, and 7C are used as the semiconductor devices that drive the servomotors, heat that is generated at a group consisting of the semiconductor device that drives the main spindle motor and the semiconductor device that is used for the rectifier is radiated out of the housing by the heat radiator 2. Heat that is generated at a group consisting of the semiconductor devices that drive the servomotors is conducted to the heat radiator 2 by way of the heat radiator 3 to be radiated out of the housing by the heat radiator 2.

As stated earlier, making the volume of the heat radiator 3 as small as possible is desirable in terms of effective utilization of the internal equipment installation space of the housing 10. The power losses are smaller at the semiconductor device group that drive the servomotors than at the group consisting of the semiconductor device that drives the main spindle motor and the semiconductor device that is used for the rectifier, so that even when the heat radiator 3 has a smaller volume, the semiconductor devices 7 each undergo a temperature increase that is small. On the other hand, the power losses are larger at the group consisting of the semiconductor device that drives the main spindle motor and the semiconductor device that is used for the rectifier, so that increasing the volume of the heat radiator 2 in the motor drive device 1 to deal with these power losses leads to suppressed elevation of the temperature TH2 of the heat radiator 2. In this way, temperature elevation of the group consisting of the semiconductor device that drives the main spindle motor and the semiconductor device that is used for the rectifier is suppressed, and even the temperature TH3 of the heat radiator 3 is suppressed. Consequently, also the semiconductor devices that drive the servomotors undergo suppressed temperature elevation.

Figure 6:
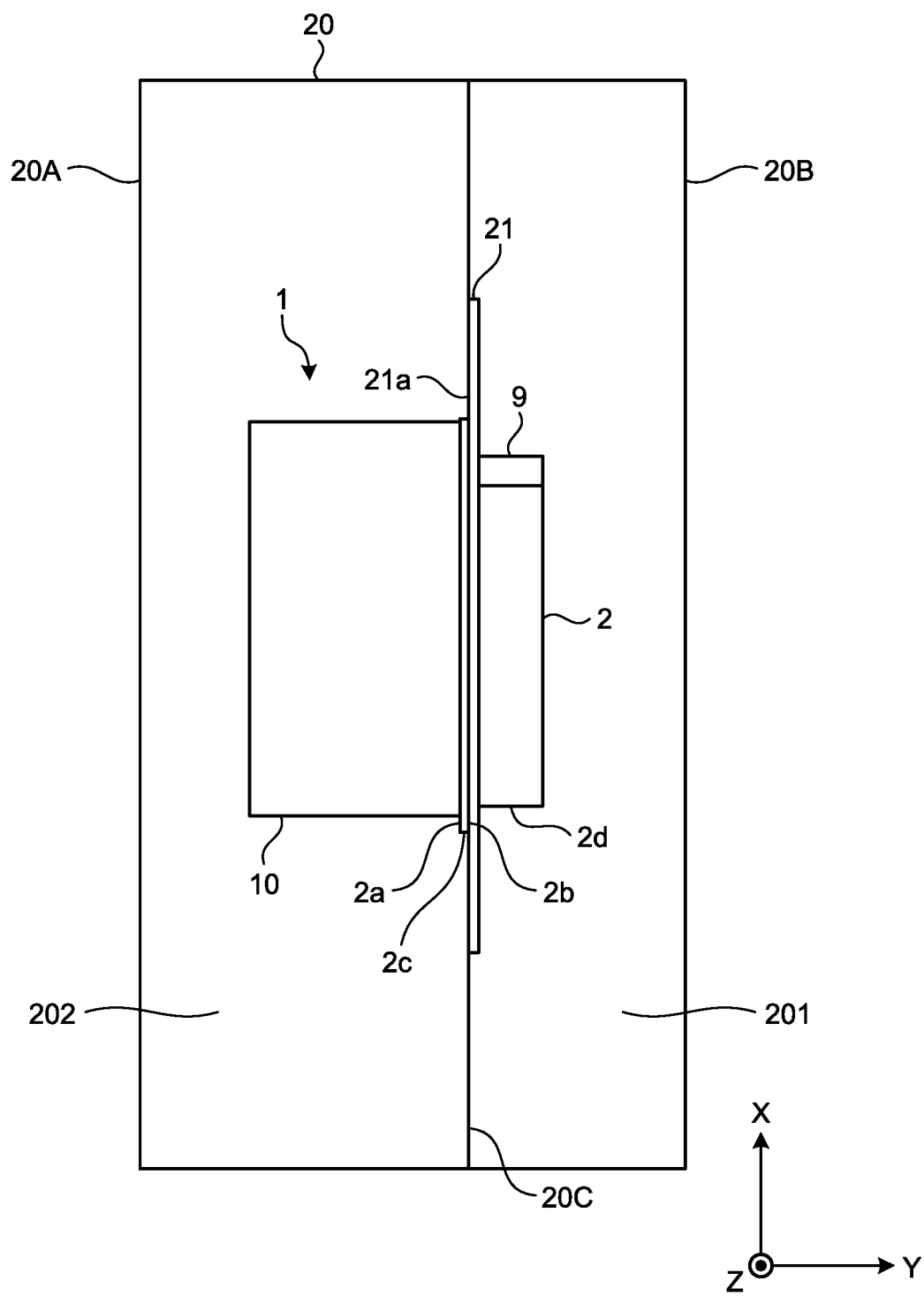
FIG. 6 illustrates an inside appearance of a control panel mounted with the motor drive device illustrated in FIG. 1.

A description is hereinafter provided of the motor drive device 1 being mounted to the control panel. FIG. 6 illustrates an inside appearance of the control panel mounted with the motor drive device illustrated in FIG. 1. FIG. 6 illustrates the partition plate 20C of the control panel 20 seen from inside along the Z-axis, an outside appearance of the motor drive device 1 mounted to the partition plate 20C, a front plate 20A of the control panel 20, and a rear plate 20B of the control panel 20.

The partition plate 20C is a plate-shaped member partitioning an internal space of the control panel 20 into a ventilation space 201 that serves as a passage for cooling air including particulates such as oil mist or dust, and a dustproof space 202 that provides protection from the particulates that might otherwise enter from the ventilation space 201. The partition plate 20C is fixed to a ceiling plate of the control panel 20 at its end positioned in the one X-axis direction and is fixed to a bottom plate of the control panel 20 at its end positioned in the other X-axis direction, thus extending from the ceiling plate to the bottom plate.

Figure 7:
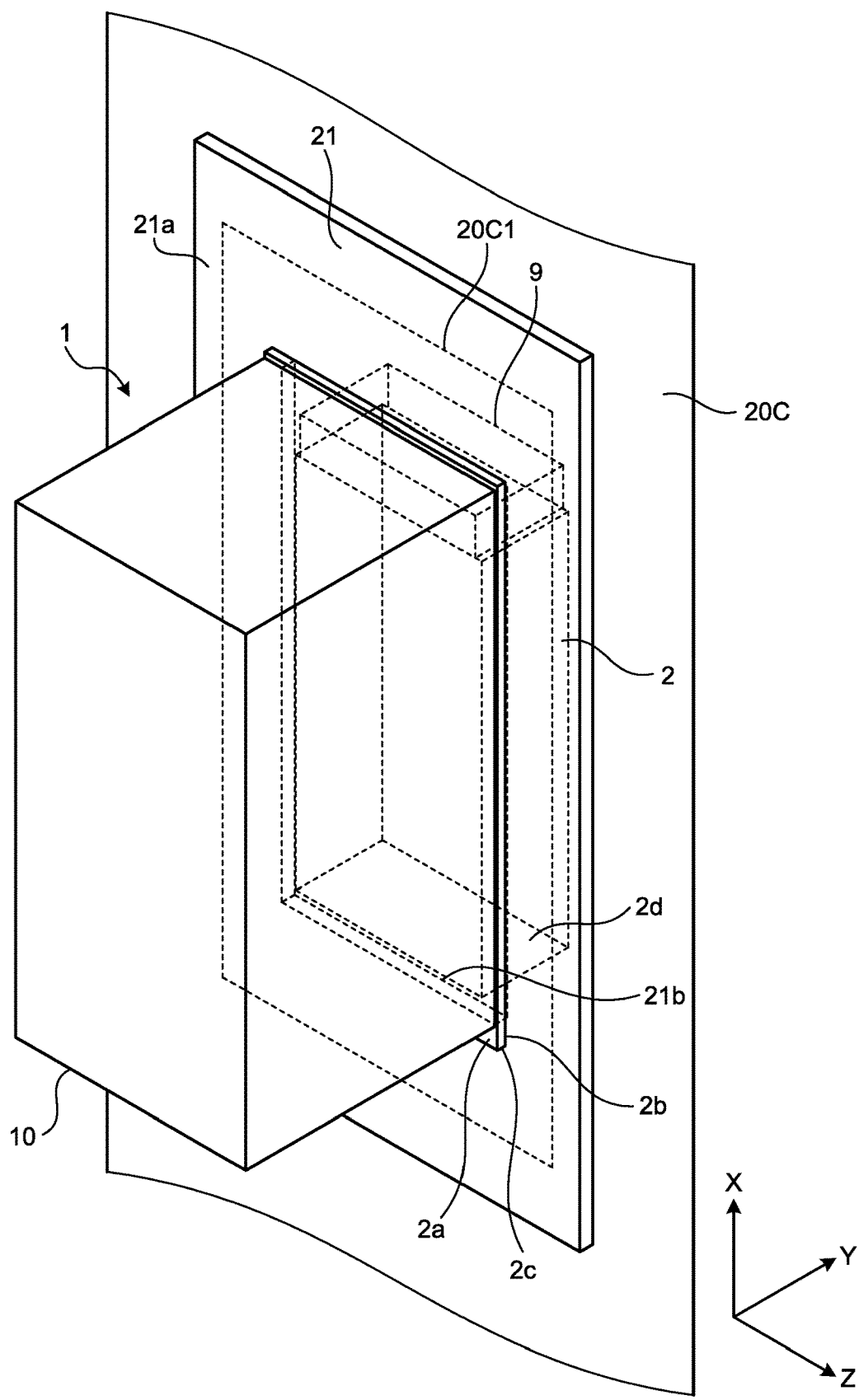
FIG. 7 illustrates an outside appearance in perspective of the motor drive device placed at a partition plate by means of a mounting member that is illustrated in FIG. 6.

FIG. 7 illustrates an outside appearance in perspective of the motor drive device placed at the partition plate by means of a mounting member that is illustrated in FIG. 6. Fixed to the partition plate 20C is the mounting member 21 that is used to secure the motor drive device 1 to the partition plate 20C.

The mounting member 21 is a heat radiation member having the shape of a square or rectangular plate with four interior angles being right angles. The mounting member 21 only has to be a plate-shaped member with which the motor drive device 1 can be secured to the partition plate 20C and thus is not limited to the square or rectangular shape. Metals can be given as examples of a material for the mounting member 21 and include aluminum, an austenitic stainless alloy, a copper alloy, cast iron, steel, and an iron alloy.

An X-Z plane of the mounting member 21 has a larger area than an area of an opening 20C1 formed in the partition plate 20C. The opening 20C1 is provided in an area obtained by projection of the mounting member 21 in the direction of the partition plate 20C.

The mounting member 21 is mounted to the partition plate 20C with plate surface 21a closer to the partition plate 20C being parallel to the front plate 20A and the rear plate 20B that are illustrated in FIG. 6. The mounting member 21 may be fixed to the partition plate 20C by means of screws that are screwed into the partition plate 20C or by being welded at contact part of the mounting member 21 with the partition plate 20C.

As illustrated in FIG. 7, the mounting member 21 is formed with an opening 21b. An area of the opening 21b is smaller than an area of an X-Z plane of the fin base 2c of the heat radiator 2 and is larger than an area of an X-Z plane of the fins 2d of the heat radiator 2. The opening 21b is provided in an area obtained by projection of the fin base 2c in the direction of the mounting member 21.

A procedure for mounting the motor drive device 1 to the control panel 20 is as follows. The mounting member 21 is fixed to the partition plate 20C first to close the opening 20C1 of the partition plate 20C. Next, the fins 2d of the motor drive device 1 are inserted in the opening 21b of the mounting member 21, and the motor drive device 1 is pushed in along the Y-axis until the second plate surface 2b of the fin base 2c comes into contact with the mounting member 21. Lastly, the fin base 2c is fixed to the mounting member 21 with the second plate surface 2b of the fin base 2c in contact with the mounting member 21.

In this way, the housing 10 of the motor drive device 1 is provided in the dustproof space 202, and the heat radiator 2 of the motor drive device 1 is provided in the ventilation space 201. In addition, the opening 21b of the mounting member 21 is closed with the fin base 2c, whereby cooling air flowing in the ventilation space 201 can be prevented from entering the dustproof space 202.

While the mounting member 21 is used in the present embodiment for mounting the motor drive device 1 to the partition plate 20C, it is to be noted that the fin base 2c may be fixed directly to the partition plate 20C without the mounting member 21 by, for example, increasing the area of the X-Z plane of the fin base 2c or reducing the area of the opening 20C1 of the partition plate 20C.

The motor drive device 1 thus mounted to the control panel 20 is provided with the fan 9. When operated, the fan 9 produces an air flow in the ventilation space 201 and in some cases, produces in the ventilation space 201 a convection current of cooling air including particulates such as oil mist or dust.

In the control panel 20 using the motor drive device 1 according to the present embodiment, the dustproof space 202 is separated from the ventilation space 201 by the fin base 2c that is placed to close the opening 20C1 of the partition plate 20C, and those including the semiconductor devices and the substrates are provided on the fin base 2c closer to a dustproof space 202, while the fins 2d that radiate heat are provided on the fin base 2c closer to a ventilation space 201.

As such, a measure such as treatment of each of those including the semiconductor devices and the substrates with a special coating is not required for preventing adhesion of the particulates. Therefore, the motor drive device 1 is susceptible of structural simplification. It is to be noted that the housing 10 of the motor drive device 1 is provided in the present embodiment to prevent, for example, a person from touching those that are included in the motor drive device 1 mounted to the control panel 20, such as the semiconductor devices and the substrates. As such, even without the housing 10, particulates such as oil mist and dust can be prevented from adhering to those including the semiconductor devices and the substrates.

Because of being placed on the partition plate 20C closer to a dustproof space 202, those including the semiconductor devices and the substrates can be inspected only by removal of the housing 10. The removal of the housing 10 only enables less time for maintenance of the motor drive device 1 than when the entire motor drive device 1 is removed from the control panel 20.

While the description provided in the present embodiment has been of the structural example of the motor drive device 1 including the semiconductor devices as the heat generating elements, it is to be noted that the heat generating element of the motor drive device 1 only has to be a component that generates heat when driving a motor and thus is not limited to the semiconductor device. The heat generating element may be, for example, a component such as a step-up transformer, a reactor, or a resistor. In that case, the motor drive device 1 includes a first heat generating element that drives a first motor, and a second heat generating element that drives a second motor, and the first heat generating element is thermally connected to the heat radiator 3, which is the second heat radiation part, while the second heat generating element is thermally connected to the fin base 2c, which is the first heat radiation part.

While the description provided in the present embodiment has been of the structural example of the motor drive device 1 provided in a housing that defines outlines of the control panel 20, it is to be noted that the motor drive device 1 is not limited to this position as long as the fins 2d, which form the third heat radiation part, can be cooled. There are cases where, for example, the control panel 20 is placed on a floor with the rear plate 20B removed from the housing that defines the outlines of the control panel 20. With the control panel 20 having this structure, the partition plate 20C illustrated in FIG. 6 is a part of the housing that defines the outlines of the control panel 20, and when the motor drive device 1 is mounted to the partition plate 20C, the fins 2d are provided outside the control panel 20. In other words, the fins 2d are exposed outwardly of the control panel 20. Even with this structure, heat conducted from the heat generating element to the fins 2d is radiated outside the control panel 20, and entry of dust into the dustproof space 202 is inhibited.

The above structures illustrated in the embodiment are examples of contents of the present invention, can be combined with other techniques that are publicly known and can be partly omitted or changed without departing from the gist of the present invention.

REFERENCE SIGNS LIST 1 motor drive device; 2, 3 heat radiator; 2B area; 2a first plate surface; 2b second plate surface; 2c fin base; 2d fin; 3a, 21a plate surface; 4, 5 substrate; 6, 6A, 6B, 7, 7A, 7B, 7C semiconductor device; 8 connecting member; 9 fan; 10 housing; 10a ceiling plate; 10b bottom plate; 10c front plate; 10d, 10e side plate; 20 control panel; 20A front plate; 20B rear plate; 20C partition plate; 20C1, 21b opening; 21 mounting member; 201 ventilation space; 202 dustproof space.

The invention claimed is:

1. A motor drive device comprising:
a first heat radiator being plate-shaped and including a first plate surface and a second plate surface that is a reverse surface opposite from the first plate surface;
a second heat radiator being plate-shaped and being thermally connected to the first plate surface, the second heat radiator including a third plate surface including a first normal to the third plate surface intersecting a second normal to the first plate surface;
a first heat generator to drive a first motor, the first heat generator being thermally connected to the second heat radiator;
a first substrate including a first substrate surface connected to the first heat generator, the first substrate including a third normal to the first substrate surface intersecting the second normal;
a second heat generator to drive a second motor, the second heat generator being thermally connected to the first plate surface;
a second substrate including a second substrate surface connected to the second heat generator, the second substrate including a fourth normal to the second substrate surface intersecting the third normal;
a third heat radiator thermally connected to the second plate surface; and
a housing including therein the first substrate, the second substrate, the first heat generator, and the second heat generator disposed therein, the housing includes a wall which includes the first plate surface,
wherein the first substrate is parallel to the second heat radiator and the first substrate is substantially orthogonal to the second substrate, and
wherein the first substrate and the second substrate do not contact each other, there is a space between an edge of the second substrate which faces the first substrate and a face of the first substrate, and the second heat radiator is disposed in the space.

2. The motor drive device according to claim 1, further comprising:
thermal grease between the first heat radiator and the second heat radiator.

3. The motor drive device according to claim 1, wherein the first heat radiator is connected to the second heat radiator by welding.

4. The motor drive device according to claim 1, further comprising:
a fan to fan the third heat radiator.

5. The motor drive device according to claim 1, wherein the third heat radiator has a larger volume than the second heat radiator has.

6. The motor drive device according to claim 1, wherein:
the motor drive device is a part of a control panel, and the third heat radiator is exposed outwardly of the control panel.

* * * * *